US009190080B1

(12) United States Patent
Roy et al.

(10) Patent No.: US 9,190,080 B1

(45) Date of Patent: Nov. 17, 2015

(54) METHOD AND SYSTEM FOR PROVIDING A MAGNETIC TRANSDUCER HAVING AN IMPROVED HARD BIAS SEED LAYER

(75) Inventors: Anup Ghosh Roy, Fremont, CA (US); Xiaozhong Dang, Fremont, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 1177 days.

(21) Appl. No.: 11/840,113

(22) Filed: Aug. 16, 2007

(51) Int. Cl.

*G11B 5/33* (2006.01)
*G11B 5/127* (2006.01)
*G11B 5/39* (2006.01)
*G11B 5/73* (2006.01)

(52) U.S. Cl.

CPC .............. *G11B 5/3903* (2013.01); *G11B 5/732* (2013.01)

(58) Field of Classification Search

CPC .............................. G11B 5/3903; G11B 5/732
USPC ............. 360/313, 319, 320, 321, 322, 324.12
See application file for complete search history.

(56) References Cited

U.S. PATENT DOCUMENTS 5,268,806 A 12/1993 Goubau et al.
5,638,235 A 6/1997 Gill et al.
5,666,246 A 9/1997 Gill et al.
5,883,764 A 3/1999 Pinarbasi
6,249,407 B1 6/2001 Aoshima et al.
6,590,751 B1 7/2003 Horng et al.
6,632,474 B1 10/2003 Horng et al.
6,740,397 B1 5/2004 Lee
6,934,129 B1 8/2005 Zhang et al.
6,954,343 B2 10/2005 Larson et al.
6,967,824 B2 11/2005 Marinero
7,016,165 B2 3/2006 Chien et al.
2002/0015268 A1 2/2002 Mao et al.
2007/0091514 A1* 4/2007 Freitag et al. ............ 360/324.12
2007/0091515 A1* 4/2007 Freitag et al. ............ 360/324.12
2008/0117552 A1* 5/2008 Zhou et al. .................... 360/319

OTHER PUBLICATIONS

J.K Howard, "The effect of Cr and W nucleation layers on the magnetic properties of CoPt films", Journal of Applied Physics 63 (8), pp. 3263-3265, Apr. 15, 1998.

Tsoukatos et al., "Cr\(CoPtCr,CoPtx) layered film studies for hard bias applications", Journal of Applied Physics 79 (8), pp. 5018-5020, Apr. 15, 1996.

G. Choe et al., "High coercivity CoPtCr, CoPtCr films deposited at high power and high bias conditions for hard bias applications in magnetoresistive heads", Journal of Applied Physics 81 (8), pp. 4894-4896, Apr. 15, 1997.

* cited by examiner

*Primary Examiner* — Gustavo Polo

(57) ABSTRACT

A method and system for providing a magnetic transducer is described. The method and system include providing an underlayer, a seed structure, and a magnetically hard layer. The underlayer has a surface. The seed structure resides on the surface and includes an amorphous layer and a seed layer. The amorphous layer wets the surface of the underlayer. The seed layer having a natural growth texture. The magnetically hard layer resides on the seed structure. The seed layer resides between the magnetically hard layer and the amorphous layer. The magnetically hard layer has a desired crystal orientation corresponding to the natural growth texture of the seed layer.

39 Claims, 3 Drawing Sheets

METHOD AND SYSTEM FOR PROVIDING A MAGNETIC TRANSDUCER HAVING AN IMPROVED HARD BIAS SEED LAYER

BACKGROUND

FIG. 1 depicts a portion of a conventional read transducer 10, which may be part of a conventional merged head including the conventional read transducer 10 and a write transducer (not shown). The conventional read transducer 10 includes a conventional shield 12, a conventional insulator 14, read sensor 16, conventional seed layers 18A and 18B, conventional hard bias structures 20A and 20B, conventional leads 22A and 22B, conventional insulator 24, and conventional shield 26. Typically, the read sensor 16 is a magnetoresistive or giant magnetoresistive sensor, such as a spin valve or a tunneling magnetoresistive junction. In such a case, the read sensor 16 would typically include at least an antiferromagnetic pinning layer, a magnetic pinned layer adjacent to the antiferromagnetic pinning layer, a nonmagnetic spacer layer, and a free layer. For simplicity, these layers are not separately shown in FIG. 1. The magnetization of the free layer changes direction based upon the magnetic field from a recording medium (not shown). The change in the relative orientations of the magnetization of the free and pinned layers alters the resistance of the read sensor 16. Thus, the read sensor 16 allows the conventional magnetic transducer 10 to read data.

The conventional insulators 14 and 24 are used to electrically insulate the read sensor 16. The conventional shields 12 and 26 are used to magnetically isolate the read sensor 16. Thus, only the magnetic field from the portion of the recording media desired to be read is experienced by the conventional read sensor 16. The conventional leads 22A and 22B are used to carry current to and from the conventional read sensor 16. The current can be used to sense the resistance of the read sensor 16, and thus read the stored data in the recording media.

FIG. 2 depicts a close-up view of a portion of the conventional read transducer 10. In particular, the conventional hard bias structure 20A/20B, the conventional seed layer 18A/18B, and the insulator 14 are shown. Referring to FIGS. 1 and 2, the conventional seed layer 18A/18B is formed prior to the conventional hard bias structure 20A/20B. The seed layer 18A/18B is desired to provide a surface suitable for growth of the conventional hard bias structure 20A/20B. The conventional seed layer 18A/18B is typically composed of a layer of Cr, CrV, or CrTi.

The conventional magnetic hard bias structures 20A and 20B are used to magnetically bias the read sensor 16. For example, the conventional magnetic hard bias structures 20A and 20B may ensure that the free layer (not specifically shown in FIGS. 1 and 2) is stable and single domain. To ensure the stability of the read sensor 16, the conventional magnetic hard bias structures 20A and 20B should not be affected by external magnetic fields, for example from the recording media or write transducer. The conventional hard bias structures 20A and 20B are desired to have a high remanence magnetization, a large coercivity, and be thermally stable. The conventional hard bias structures 20A and 20B are thus typically formed of materials such as CoPt or CoCrPt.

Although the conventional magnetic transducer 10 functions, one of ordinary skill in the art will recognize that there are drawbacks. In particular, the magnetization of the conventional hard bias structures 20A and 20B may be disturbed during operation of the conventional magnetic read transducer 10. This is particularly possible when the conventional read transducer 10 is exposed to both a high magnetic field and a high temperature. As a result, the free layer (not separately shown in FIGS. 1 and 2) may be destabilized. Consequently, performance of the conventional magnetic transducer 10 may be adversely affected Accordingly, what is needed is a system and method for providing an improved hard bias structure.

BRIEF SUMMARY OF THE INVENTION

A method and system for providing a magnetic transducer is described. The method and system include providing an underlayer, a seed structure, and a magnetically hard layer. The underlayer has a surface. The seed structure resides on the surface and includes an amorphous layer and a seed layer. The amorphous layer wets the surface of the underlayer. The seed layer having a natural growth texture. The magnetically hard layer resides on the seed structure. The seed layer resides between the magnetically hard layer and the amorphous layer. The magnetically hard layer has a desired crystal orientation corresponding to the natural growth texture of the seed layer.

DETAILED DESCRIPTION OF THE PREFERRED EMBODIMENTS

Figure 1:
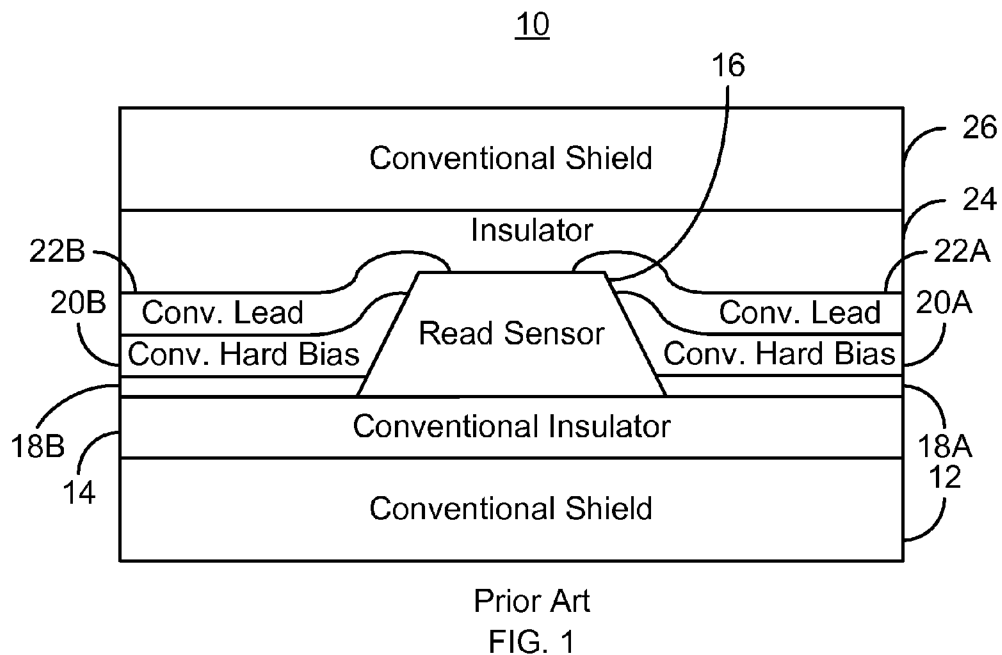
FIG. 1 is a diagram of a conventional read transducer.
Figure 2:
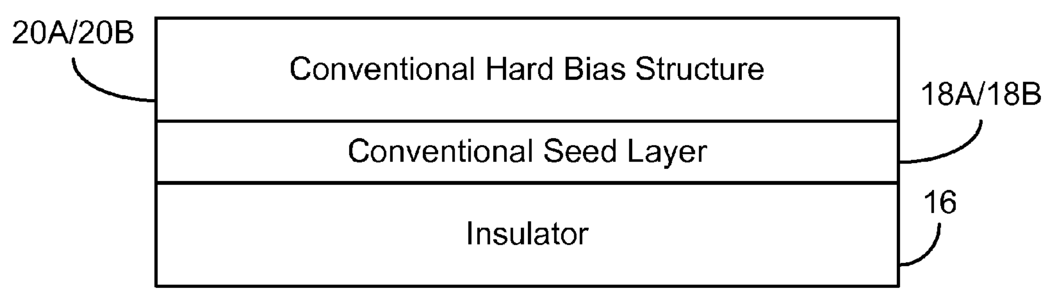
FIG. 2 depicts a portion of the conventional read transducer.
Figure 3:
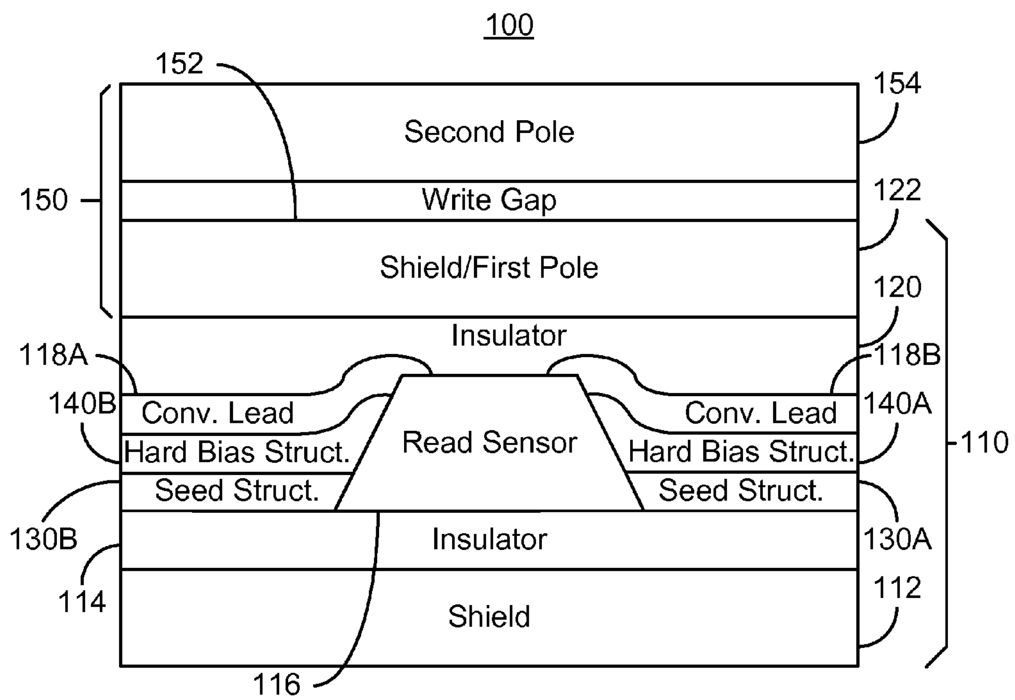
FIG. 3 depicts an exemplary embodiment in accordance with the present invention of a magnetic head in accordance with the present invention.

FIG. 3 depicts an exemplary embodiment in accordance with the present invention of a magnetic head 100. The magnetic head 100 is a merged head including a read transducer 110 and a write transducer 150. However, in an alternate embodiment, the magnetic head 100 may be a read head only. Thus, the write transducer 150 might be omitted. The read transducer 110 includes a first shield 112, an insulator 114, a read sensor 116, leads 118A and 118B, insulator 120, a second shield 122, seed structures 130A and 130B, and hard bias structures 140A and 140B. The second shield 122 may also act as at least part of the first pole for the write transducer 150. The write transducer includes the second shield/first pole 122, write gap 152, and second pole 154. For clarity, only these portions of the write transducer 150 are shown. In an alternate embodiment, the write transducer may include additional and/or different components.

The read sensor 116 is generally a magnetoresistive or giant magnetoresistive sensor, such as a spin valve or tunneling magnetoresistive sensor. In such a case, the read sensor 116 may include at least an antiferromagnetic pinning layer, a magnetic pinned layer adjacent to the antiferromagnetic pinning layer, a nonmagnetic spacer layer, and a free layer. An additional nonmagnetic spacer layer, an additional pinned layer, and an additional antiferromagnetic pinning layer may also be used. For simplicity, these layers are not separately shown in FIG. 3.

The insulators 114 and 120 may be used to electrically insulate the read sensor 116. The shields 112 and 122 may be used to magnetically isolate the read sensor 16. Thus, substantially only the magnetic field from the portion of the recording media desired to be read is experienced by the read sensor 116. The leads 118A and 118B are used to carry current to and from the read sensor 116. In the embodiment shown, the leads 118A and 118B are shown in the current-in-plane (horizontally in FIG. 3) configuration. In an alternate embodiment, the leads 118A and 118B shown may have another configuration. For example, in another embodiment (not shown), the leads 118A and 118B might be in the current-perpendicular-to-plane (vertically in FIG. 3) configuration. In such an embodiment, the leads 118A and 118B would form a single lead that makes electrical contact at the top of the read sensor 116 while the another lead (not shown) makes electrical contact at the bottom of the read sensor 116.

Also shown in FIG. 3 are the seed structures 130A and 130B and the hard bias structures 140A and 140B. In one embodiment, the seed structures 130A and 130B are formed together. Similarly, the hard bias structures 140A and 140B may be formed together. Each of the seed structures 130A and 130B includes a bilayer structure, as described below. The hard bias structures 140A and 140B may be an alloy, such as CoPt, CoCrPt, and/or CoSm and may be a single layer or a multilayer. The hard bias structures 140A and 140B and seed structures 130A and 130B are described more particularly with respect to FIG. 4.

Figure 4:
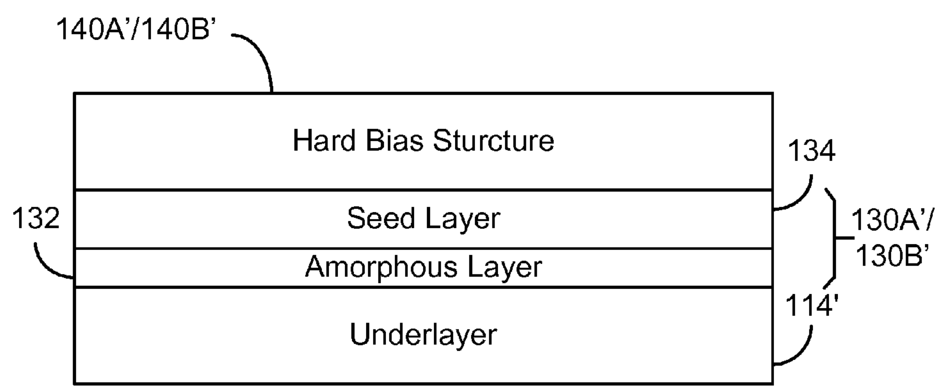
FIG. 4 depicts an exemplary embodiment in accordance with the present invention of the hard bias and seed structures of a magnetic transducer.

FIG. 4 depicts an exemplary embodiment in accordance with the present invention of the hard bias structure 140A'/140B' and seed structure 130A'/130B' of a magnetic transducer in accordance with the present invention. The hard bias structure 140A'/140B' and seed structure 130A'/130B' correspond to the hard bias structures 140A and 140B and seed structures 130A and 130B, respectively, of FIG. 3. Although the hard bias structure 140A'/140B' and the seed structure 130A'/130B' are described in the context of biasing a read sensor such as the read sensor 100, the hard bias structure 140A'/140B' and seed structure 130A'/130B' could be used for other purposes. Also depicted in FIG. 4 is underlayer 114' that corresponds to the insulator 114. Thus, in one embodiment, the underlayer 114 is aluminum oxide.

The seed structure 130A'/130B' is a bilayer that is formed on a surface of the underlayer 114'. The seed structure 130A'/130B' includes an amorphous layer 132 and a seed layer 134. The amorphous layer is configured to wet the surface of the underlayer 114'. Thus, the amorphous layer 132 is more likely to form a continuous film on the surface of the underlayer 114'. In one embodiment, the amorphous layer is metallic and has a high melting point, for example at least one thousand two hundred degrees centigrade. The high melting point may allow the material used for the amorphous layer 132 to more readily wet the surface of the underlayer 114'. In one embodiment, the amorphous layer includes Ti and/or Ta. However, in another embodiment, the amorphous layer 132 could include other materials, such as ZrB, CoFeZrB, and CoFeZrBCu. The thickness of the amorphous layer 132 is such that the surface of the underlayer 114' on which the amorphous layer 132 resides is completely coated. The amorphous layer thus may have a thickness of at least ten Angstroms. In one embodiment, the amorphous layer 132 has a thickness of not more than forty Angstroms. In an alternate embodiment, the amorphous layer 132 has a thickness of not more than one hundred Angstroms.

The seed layer 134 is a separate layer grown on the amorphous layer 132. The seed layer 134 has a natural growth texture. This natural growth texture may be achieved because the seed layer 134 is grown on the amorphous layer 132. The material for the seed layer 134 is selected such that the natural growth texture aids in obtaining the desired crystal orientation for the hard bias structure 140A'/140B'. The magnetic properties of the hard bias structure 140A'/140B' depend upon the crystal structure of the hard bias structure 140A'/140B'. In particular, the desired orientation aids in obtaining the desired magnetic properties of the hard bias structure 140A'/140B'. Thus, the material(s) used for seed layer 134 used depend upon the desired crystal orientation of the material used for the hard bias structure 140A'/140B'. In one embodiment, the seed layer 134 has a body centered cubic (BCC) crystal structure and a (110) natural growth texture. In such an embodiment, the desired crystal orientation may be (10*0), for example for a hexagonal close-packed (hcp) material such as CoPt.

In addition to the texture, other properties of the seed layer 134 may aid in obtaining the desired crystal orientation, and thus desired magnetic properties for the hard bias structure 140A'/140B'. One of these properties of the seed layer 134 is the lattice constant of the seed layer 134. The lattice constant of the seed layer 134 may be sufficiently close to the lattice constant of the material used for the hard bias structure 140A'/140B'. In one embodiment, the mismatch between the lattice constant of the seed layer 134 and the lattice constant of the hard bias structure 140A'/140B' is not more than twenty percent. Thus, the seed layer 134 is desired to have a natural growth texture corresponding to the desired crystal structure and orientation of the hard bias structure 140A'/140B' and have a lattice constant that is sufficiently close to the lattice constant of the material(s) used for the hard bias structure 140A'/140B'. Consequently, in one embodiment, the seed layer 134 includes W or V. The thickness of the seed layer 134 may be at least ten Angstroms. In another embodiment, the seed layer 134 may be at least fifty Angstroms.

The hard bias structure 140A'/140B' may be formed from a layer of magnetically hard material fabricated on the seed layer 134. Thus, the seed layer 134 resides between the magnetically hard layer forming the hard bias structures 140A'/140B' and the amorphous layer 132. The hard bias structure 140A'/140B' has a desired crystal orientation corresponding to the natural growth texture of the seed layer 134. Thus, the hard bias structure 140A'/140B' may include at least one of CoPt, CoSm, and CoCrPt having a hcp structure and a desired crystal orientation of (10*0) for a bcc seed layer 134, such as W, having a (110) natural growth texture. If the hard bias structure 140A'/140B' includes CoPt, in one embodiment the CoPt may have at least five percent and not more than forty percent Pt.

Because of the use of the seed layer structure 130A/130B/130A'/130B' the hard bias structure 140A/140B/140A'/140B' may have a desired crystal orientation: closer to the desired (10*0) for hcp CoPt. As a result, the coercivity of the hard bias structure 140A/140B/140A'/140B' may be improved. In particular, the coercivity may be increased and the distribution of coercivities for hard bias structures 140A/140B/140A'/140B' may be reduced. Moreover, the magnetic properties of the hard bias structure 140A/140B/140A'/140B' may be stable over a wider range of temperatures. In addition, the grain and domain size of the hard bias structure 140A/140B/140A'/140B' may be comparable to that of the conventional hard bias structure 20A/20B. Consequently, the hard bias structure 140A/140B/140A'/140B' may have improved ability to bias and stabilize the read sensor 116. The magnetic head 100 may, therefore, have improved performance.

Figure 5:
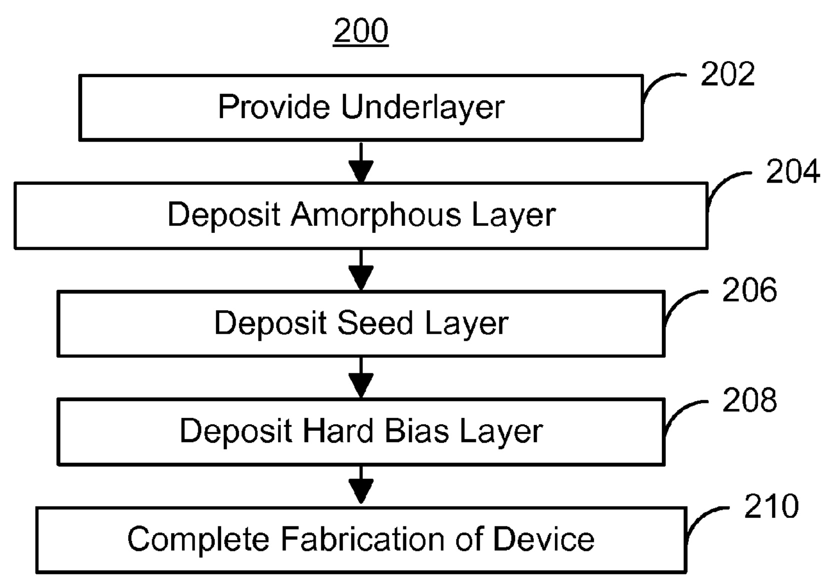
FIG. 5 is a flow chart depicting a method in accordance with an exemplary embodiment of the present invention

FIG. 5 is a flow chart depicting an exemplary embodiment in accordance with the present invention of a method 200 in accordance with an exemplary embodiment of the present invention. For clarity, the method 200 is described in the context of the magnetic head 100, particularly the seed structure 130A/130B/130K/130B' and the hard bias structure 140A/140B/140A'/140B'. However, in another embodiment, the method 200 may be used for forming a seed structure and hard bias structure in another device. In addition, for simplicity, some steps may have been omitted. Thus, the method 200 may include other and/or additional steps not inconsistent with the method and system described herein.

The underlayer 114/114' is provided, via step 202. In one embodiment, step 202 includes depositing aluminum oxide. The amorphous layer 132 of the seed structure 130A/130B/130K/130B' is deposited on the underlayer 114/114', via step 204. Step 204 is preferably performed after formation of the read sensor 116. The read sensor 116 is generally formed by depositing the layers for the read sensor, using a mask to cover the portion of the layers to be used as the read sensor, and defining the read sensor. In one embodiment, deposition of the amorphous layer 132 in step 204 includes depositing a high melting point metal such as Ta or Ti. Step 204 also includes depositing a sufficient amount of material that the amorphous layer 132 coats the exposed surface of the underlayer 114/114'.

The seed layer 134 is deposited on the amorphous layer 132, via step 206. In one embodiment, the seed layer 134 is deposited at an angle. For example, for a W seed layer 134, deposition may occur at an angle of approximately twenty five through thirty-five degrees from normal to the surface of the underlayer 114/114'. However, in another embodiment another angle can be used. The seed layer 134 deposited on the amorphous layer 132 preferably has the natural texture described above. Thus, the seed structure 130A/130B/130K/130B' is formed in steps 204 and 206.

The hard bias material for the hard bias structure 140A/140B/140A'/140B' is deposited, via step 208. Step 208 may thus include depositing a CoPt, CoCrPt, or CoSm alloy. Formation of the device 100 may then be completed, via step 210.

The method 200 may be used to fabricate the seed structure 130A/130B/130K/130B' and the hard bias structure 140A/140B/140A'/140B'. Because the material for the hard bias structure 140A/140B/140A'/140B' is deposited on the seed layer 134 in step 208, the hard bias structure 140A/140B/140A'/140B' has the desired crystal orientation. Consequently, the hard bias structure 140A/140B/140A'/140B' may have a higher coercivity and improved thermal stability. As a result, performance of the magnetic read head 100 may be improved.

We claim:

1. A magnetic transducer comprising:
an underlayer having a top surface;
a magnetoresistive sensor residing on a first portion of the top surface;
a seed structure on a second portion of the top surface, the seed structure including an amorphous layer and a seed layer, the amorphous layer wetting the second portion of the top surface of the underlayer, the seed layer having a natural growth texture, no portion of the seed structure residing between the underlayer and the magnetoresistive sensor such that no portion of the amorphous layer and no portion of the seed layer are between the underlayer and the magnetoresistive sensor; and
a magnetically hard layer on the seed structure, the seed layer residing between the magnetically hard layer and the amorphous layer, the magnetically hard layer having a desired crystal orientation corresponding to the natural growth texture of the seed layer.

2. The magnetic transducer of claim 1 wherein at least a portion of the magnetically hard layer adjoins the magnetoresistive sensor.

3. The magnetic transducer of claim 1 wherein the amorphous layer includes a layer having a high melting point.

4. The magnetic transducer of claim 3 wherein the high melting point is at least 1200° Celsius.

5. The magnetic transducer of claim 4 wherein the amorphous layer includes at least one of Ti and Ta.

6. The magnetic transducer of claim 1 wherein the amorphous layer has a thickness of not more than one hundred Angstroms.

7. The magnetic transducer of claim 6 wherein the amorphous layer has a thickness of not more than forty Angstroms.

8. The magnetic transducer of claim 6 wherein the amorphous layer has a thickness of at least ten Angstroms.

9. The magnetic transducer of claim 3 wherein the magnetically hard layer includes at least one of CoPt, CoSm, and CoCrPt.

10. The magnetic transducer of claim 9 wherein the magnetically hard layer includes CoPt and wherein the CoPt includes at least five percent and not more than forty percent Pt.

11. The magnetic transducer of claim 1 wherein the seed layer has a body centered cubic (BCC) crystal structure and the natural growth texture is (110).

12. The magnetic transducer of claim 11 wherein the desired crystal orientation is (10*0).

13. The magnetic transducer of claim 12 wherein the magnetically hard layer includes at least one of CoPt, CoSm, and CoCrPt.

14. The magnetic transducer of claim 13 wherein the magnetically hard layer includes CoPt and wherein the CoPt includes at least five percent and not more than forty percent Pt.

15. The magnetic transducer of claim 11 wherein the seed layer has a first lattice constant, the magnetically hard layer has a second lattice constant, and wherein the first lattice constant has a lattice mismatch from the second lattice constant of not more than twenty percent.

16. The magnetic transducer of claim 11 wherein the seed layer includes W.

17. The magnetic transducer of claim 11 wherein the seed layer has a thickness of at least ten Angstroms.

18. The magnetic transducer of claim 17 wherein the thickness is at least fifteen Angstroms.

19. A magnetic transducer comprising:
an underlayer having a top surface;
a magnetoresistive sensor residing on a first portion of the top surface;
a seed structure on a second portion of the top surface, the seed structure including an amorphous layer and a seed layer, the amorphous layer consisting of at least one of Ti and Ta, the seed layer including W, no portion of the seed structure residing between the underlayer and the magnetoresistive sensor such that no portion of the amorphous layer and no portion of the seed layer are between the underlayer and the magnetoresistive sensor; and
a magnetically hard layer on the seed structure, the seed layer residing between the magnetically hard layer and the amorphous layer, the magnetically hard layer having a desired crystal orientation corresponding to a natural growth texture of the seed layer.

20. The magnetic transducer of claim 19 wherein the magnetically hard layer includes at least one of CoPt, CoSm, and CoCrPt.

21. A magnetic head comprising:

an underlayer having a top surface;

a magnetoresistive sensor residing on a first portion of the top surface;

a seed structure on a second portion of the top surface, the seed structure including an amorphous layer and a seed layer, the amorphous layer wetting the second portion of the top surface of the underlayer, the seed layer having a natural growth texture, no portion of the seed structure residing between the underlayer and the magnetoresistive sensor such that no portion of the amorphous layer and no portion of the seed layer are between the underlayer and the magnetoresistive sensor; and a magnetically hard layer on the seed structure, the seed layer residing between the magnetically hard layer and the amorphous layer, the magnetically hard layer having a desired crystal orientation corresponding to the natural growth texture of the seed layer.

22. The magnetic head of claim 21 wherein at least a portion of the magnetically hard layer adjoining the magnetoresistive sensor.

23. The magnetic head of claim 22 wherein the amorphous layer includes a layer having a high melting point.

24. The magnetic head of claim 23 wherein the high melting point is at least 1200° Celsius.

25. The magnetic head of claim 24 wherein the amorphous layer includes at least one of Ti and Ta.

26. The magnetic head of claim 25 wherein the amorphous layer has a thickness of not more than forty Angstroms.

27. The magnetic head of claim 26 wherein the amorphous layer has a thickness of at least ten Angstroms.

28. The magnetic head of claim 23 wherein the magnetically hard layer includes at least one of CoPt, CoSm, and CoCrPt.

29. The magnetic head of claim 28 wherein the magnetically hard layer includes CoPt and wherein the CoPt includes at least five percent and not more than forty percent Pt.

30. The magnetic head of claim 21 wherein the seed layer has a body centered cubic (BCC) crystal structure and the natural growth texture is (110).

31. The magnetic head of claim 30 wherein the desired crystal orientation is (10*0).

32. The magnetic head of claim 31 wherein the magnetically hard layer includes at least one of CoPt, CoSm, and CoCrPt.

33. The magnetic head of claim 32 wherein the magnetically hard layer includes CoPt and wherein the CoPt includes at least five percent and not more than forty percent Pt.

34. The magnetic head of claim 30 wherein the seed layer has a first lattice constant, the magnetically hard layer has a second lattice constant, and wherein the first lattice constant has a lattice mismatch from the second lattice constant of not more than twenty percent.

35. The magnetic head of claim 30 wherein the seed layer includes W.

36. The magnetic head of claim 30 wherein the seed layer has a thickness of at least ten Angstroms.

37. The magnetic head of claim 30 further comprising:

a write transducer.

38. A method for providing a magnetic head comprising:

depositing an underlayer having a top surface;

providing a magnetoresistive sensor residing on a first portion of the top surface;

providing a seed structure on a second portion of the top surface, the seed structure including an amorphous layer and a seed layer, the amorphous layer wetting the second portion of the top surface of the underlayer, the seed layer having a natural growth texture, no portion of the seed structure residing between the underlayer and the magnetoresistive sensor such that no portion of the amorphous layer and no portion of the seed layer are between the underlayer and the magnetoresistive sensor; and providing a magnetically hard layer on the seed structure, the seed layer residing between the magnetically hard layer and the amorphous layer, the magnetically hard layer having a desired crystal orientation corresponding to the natural growth texture of the seed layer.

39. The method of claim 38 wherein the seed structure providing further includes:

depositing the amorphous layer, the amorphous layer including at least one of Ta and Ti; and depositing the seed layer, the seed layer including W.

* * * * *